US011796593B2

(12) United States Patent
Mendelson et al.

(10) Patent No.: US 11,796,593 B2
(45) Date of Patent: Oct. 24, 2023

(54) COMPILER-BASED CODE GENERATION FOR POST-SILICON VALIDATION

(71) Applicant: Synopsys, Inc., Sunnyvale, CA (US)

(72) Inventors: Hillel Mendelson, Kibbutz Hahotrim (IL); Tom Kolan, Haifa (IL); Shay Aviv, Haifa (IL); Vitali Sokhin, Haifa (IL); Wesam Saleem Ibraheem, Massada (IL)

(73) Assignee: Synopsys, Inc., Sunnyvale, CA (US)

( * ) Notice: Subject to any disclaimer, the term of this patent is extended or adjusted under 35 U.S.C. 154(b) by 182 days.

(21) Appl. No.: 17/330,778

(22) Filed: May 26, 2021

(65) Prior Publication Data

US 2022/0381824 A1 Dec. 1, 2022

(51) Int. Cl.
*G01R 31/28* (2006.01)
*G01R 31/3183* (2006.01)
*G01R 31/319* (2006.01)

(52) U.S. Cl.
CPC ........... *G01R 31/318314* (2013.01); *G01R 31/31908* (2013.01); *G01R 31/31915* (2013.01); *G01R 31/318307* (2013.01)

(58) Field of Classification Search
CPC .... G01R 31/318314; G01R 31/318307; G01R 31/31908; G01R 31/31915
See application file for complete search history.

(56) References Cited

U.S. PATENT DOCUMENTS

| | | | |
|---|---|---|---|
| 9,858,371 B1 | 1/2018 | Ovadia | |
| 10,061,685 B1* | 8/2018 | White | G06F 11/3692 |
| 11,194,705 B2 | 12/2021 | Mendelson | |
| 11,204,859 B2 | 12/2021 | Kolan | |
| 2005/0086565 A1* | 4/2005 | Thompson | G06F 30/33 714/E11.167 |
| 2009/0222694 A1* | 9/2009 | Adir | G06F 30/33 714/26 |
| 2011/0087861 A1 | 4/2011 | Bertacco | |
| 2013/0013246 A1 | 1/2013 | Adir | |
| 2015/0186250 A1* | 7/2015 | Friedler | G06F 11/261 717/124 |

OTHER PUBLICATIONS

"Compiler Explorer," godbolt.org, accessed May 14, 2021, 1 page. <https://godbolt.org/z/bxcEP8>.
Anonymous, "Coverage Automation using Traces(CAT) in Post Silicon Validation," IP.com, Disclosure No. IPCOM000261917D, Apr. 17, 2020, 4 pages. <https://priorart.ip.com/IPCOM/000261917>.

(Continued)

*Primary Examiner* — Christine T. Tu
(74) *Attorney, Agent, or Firm* — Fenwick & West LLP (57) ABSTRACT

Embodiments relate to a system, program product, and method for integrating compiler-based testing in post-silicon validation. The method includes generating a test program through a device-under-test (DUT). The method also includes generating a plurality of memory intervals and injecting the plurality of memory intervals into the test program. The method further includes injecting a plurality of compiled test snippets into the test program and executing one or more post-silicon validation tests for the DUT with the test program.

20 Claims, 5 Drawing Sheets

(56) References Cited

OTHER PUBLICATIONS

Kadry et al., "Improving Post-Silicon Validation Efficiency by Using Pre-Generated Data," ResearchGate, Nov. 2013, 16 pages. <https://www.researchgate.net/publication/299681518_Improving_Post-silicon_Validation_Efficiency_by_Using_Pre-generated_Data>.

Moharikar et al., "Automated test generation for post silicon microcontroller validation," 2017 IEEE International High Level Design Validation and Test Workshop (HLDVT), Dec. 7, 2017, 8 pages. <https://ieeexplore.ieee.org/document/8167462>.

Wang et al., "Compiler-Managed Software-based Redundant Multi-Threading for Transient Fault Detection," Fifth International Symposium on Code Generation and Optimization (CGO 2007), Mar. 14, 2007, 13 pages. <https://www.researchgate.net/publication/220799279_Compiler-Managed_Software-based_Redundant_Multi-Threading_for_Transient_Fault_Detection>.

"Grace Period Disclosure Statement of Applicant," dated May 4, 2021, 1 page.

A. Adir et al., "Threadmill: A post-silicon exerciser for multi threaded processors," 2011 48th ACM/EDAC/IEEE Design Automation Conference (DAC), San Diego, CA, USA, 2011, pp. 860-865. https://ieeexplore.ieee.org/document/5981876.

Anonymous (2013) Method and tool for measuring test-template variability. https://priorart.ip.com/IPCOM/000227917.

S. K. Sadasivam, S. Alapati and V. Mallikarjunan, "Test Generation Approach for Post-Silicon Validation of High End Microprocessor," 2012 15th Euromicro Conference on Digital System Design, Cesme, Turkey, 2012, pp. 830-836, doi: 10.1109/DSD.2012.148.

Storm, J. (2006) Random Test Generators for Microprocessor Design Validation. Sun Microsystems, Inc. https://www.oracle.com/technetwork/systems/opensparc/53-rand-test-gen-validation-1530392.pdf <Retrieved Mar. 30, 2023>.

* cited by examiner

COMPILER-BASED CODE GENERATION FOR POST-SILICON VALIDATION

STATEMENT REGARDING PRIOR DISCLOSURES BY THE INVENTOR OR A JOINT INVENTOR

Pursuant to 37 C.F.R. § 1.130, 35 U.S.C. §§ 102(a)(1) and 102(b)(1)(A), and MPEP §§ 2153.01(a), 2155.01, 2155.02, 2155.04, 2155.05, and 2155.06, Applicant submits for consideration in the present application that the application is being filed within a one year grace period initiated by an authorized public disclosure by the joint inventors of the application. The nature of the public disclosure is the inclusion of features described in the present patent application in a commercially-available product through a release of a product update. The date of the authorized public disclosure is conservatively disclosed as the earliest possible date the features described herein were available to the public, i.e., Jan. 25, 2021.

BACKGROUND

The present disclosure relates to testing semiconductor integrated circuits, and, more specifically, to integrating compiler-based testing in post-silicon validation.

Many known modern processors include high-performance central processing units (CPUs) that are configured to execute multiple parallel operations simultaneously. For example, some known high-performance CPUs use out-of-order execution to execute instructions in an order governed by the availability of the input data and the execution units rather than by the original order in a program. In addition, many such known high-performance CPUs use simultaneous multithreading (SMT) for improving the overall efficiency of superscalar CPUs (i.e., CPUs with multiple execution units thereon for executing more than one instruction during a clock-cycle) with hardware multithreading. Moreover, such CPUs may sit on a system on a chip (SoC) that is an integrated circuit that integrates all or most components of a computer or other electronic system. At least some known post-silicon validation systems and methods validate the various features of the SoCs through test generation and execution through an exerciser.

SUMMARY

A system, computer program product, and method are provided for integrating compiler-based testing into post-silicon validation.

In one aspect, a computer system is provided for integrating compiler-based testing into post-silicon validation. The system includes one or more processing devices configured to validate operation of a device-under-test (DUT) through post-silicon validation testing. The system also includes one or more memory devices communicatively coupled to the processing device. The system further includes a compiler communicatively coupled to the one or more processing devices and the one or more memory devices. The one or more processing devices are configured to generate a test program through the DUT. The one or more processing devices are also configured to generate a plurality of memory intervals and insert the plurality of memory intervals into the test program. The one or more processing devices are further configured to inject, through the compiler, a plurality of compiled test snippets into the test program and execute one or more post-silicon validation tests for the DUT with the test program.

In another aspect, a computer program product is provided for integrating compiler-based testing into post-silicon validation. The computer program product includes one or more computer readable storage media, and program instructions collectively stored on the one or more computer storage media. The product includes program instructions to execute one or more post-silicon validation tests for a device-under-test (DUT) including program instructions to generate a test program through the DUT. The product also includes program instructions to generate a plurality of memory intervals and program instructions to inject the plurality of memory allocations into the test program. The product further includes program instructions to inject a plurality of compiled test snippets into the test program and program instructions to execute one or more post-silicon validation tests for the DUT with the test program.

In yet another aspect, a computer-implemented method is provided for integrating compiler-based testing into post-silicon validation. The method includes generating a test program through a device-under-test (DUT). The method also includes generating a plurality of memory intervals and injecting the plurality of memory allocations into the test program. The method further includes injecting a plurality of compiled test snippets into the test program and executing one or more post-silicon validation tests for the DUT with the test program.

The present Summary is not intended to illustrate each aspect of, every implementation of, and/or every embodiment of the present disclosure. These and other features and advantages will become apparent from the following detailed description of the present embodiment(s), taken in conjunction with the accompanying drawings.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are illustrative of certain embodiments and do not limit the disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

It will be readily understood that the components of the present embodiments, as generally described and illustrated in the Figures herein, may be arranged and designed in a wide variety of different configurations. Thus, the following details description of the embodiments of the apparatus, system, method, and computer program product of the present embodiments, as presented in the Figures, is not intended to limit the scope of the embodiments, as claimed, but is merely representative of selected embodiments.

Reference throughout this specification to "a select embodiment," "at least one embodiment," "one embodiment," "another embodiment," "other embodiments," or "an embodiment" and similar language means that a particular feature, structure, or characteristic described in connection with the embodiment is included in at least one embodiment. Thus, appearances of the phrases "a select embodiment," "at least one embodiment," "in one embodiment," "another embodiment," "other embodiments," or "an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Many known modern processors, e.g., processing devices such as central processing units (CPUs), include integrated circuitry therein to execute the desired functionality through one or more computative functional units and logical functional units. In addition, many known hardware designs and fabrication processes include two distinct testing phases, i.e., pre-silicon verification testing and post-silicon validation testing, both of which are described further herein. Many known processor hardware verification and validation systems and methods are configured to test semiconductor integrated circuits prior to and after fabrication of the respective integrated circuits.

Verification tools used for the manufacturing of hardware processors validate the desired behavior of the hardware given all system conditions. For example, prior to fabrication, i.e., pre-silicon, software-based verification tools are employed to test the integrated circuit designs and features through pre-silicon verification test generation. The pre-silicon verification testing of an ultra-high fidelity model of an integrated circuit design is performed on a computer-implemented simulation and testing platform that can leverage an operating system and testing software, i.e., testing tools in a virtual environment with sophisticated simulation, emulation, and formal verification tools. Such tools include, e.g., and without limitation, complex constraint satisfaction problems (CSPs) and a reference model. CSPs are mathematically-based devices defined as a set of objects whose state must satisfy a number of constraints and limitations. At least some of the known post-silicon validation systems and methods use one or more CSP solver algorithms to solve the previously described CSPs. A reference model is an architecturally accurate simulation of the integrated circuit, including the ability to emulate the intended behaviors of the integrated circuit as a result of each of the instructions such as, without limitation, the state of the processor before and after the generation of each instruction. Therefore, the integrated software is tested with the respective software to verify the integrated functionality thereof. The results of the pre-silicon verification testing may be used to make adjustments to the design of the integrated circuit, including hardware and software. Accordingly, prior to testing physical prototypes of integrated circuits, a software simulation is performed to verify the design and functionality thereof.

Once the engineers are satisfied with the quality of the hardware design in a virtual environment, one or more prototypes will be fabricated, i.e., a post-silicon product will be fabricated. The post-silicon product or prototype may be referred to as a circuit, a silicon, a processor, and as a hardware device, where the term "physical integrated circuit prototype" is used herein. Upon fabrication of a physical integrated circuit prototype subsequent to the pre-silicon verification testing, the prototype is physically tested to operationally stress the device and capture any deficiencies not captured during the pre-silicon verification testing. The post-silicon validation testing is executed through a validation platform, and more specifically, in some embodiments, through one or more bare-metal hardware exercisers. In some embodiments, any tools that enable operation of the post-silicon validation testing as described herein are used in conjunction with the bare-metal hardware exercisers, including, without limitation, reuse of a portion of the tests performed in the pre-silicon testing as generated by the pre-silicon testing tools, manually written tests, lightweight operating systems, and production workloads. Accordingly, in some embodiments, the bare-metal hardware exercisers may be used to complement other testing tools.

The bare-metal hardware exercisers are programs that run on the physical integrated circuit prototype, i.e., the device-under test (DUT), continuously generate the test cases, execute the test cases, and verify the results of the test cases. In general, to facilitate high silicon utilization within the DUT, the exerciser's software should be lightweight and simple, which is contrasted with complex test generation and extensive, complex computation. In accordance with the lightweight and simple requirements, the post-silicon validation testing may be executed without the aid of an operating system; therefore, the testing is executed bare-metal with simple exerciser software. Accordingly, the exerciser runs on hardware, for example, the DUT. In some embodiments, one or more analyzers or analysis devices, e.g., without limitation, oscilloscopes, are coupled to the DUT to collect operational data or to aid the debugging process.

In at least some embodiments, the exercisers include an off-line portion that generates exerciser images and an on-line portion that executes test exercises. Specifically, an off-line portion of the exerciser, i.e., an exerciser image builder, creates the exerciser images, which will be run on-line on the DUT, where continuously generated test programs (sometimes referred to as test cases herein) are executed and the results are checked. In some embodiments, the test programs are generated from respective test templates that specify the desired (targeted) test scenarios directed to specific features of the DUT from a verification plan. Each test template includes a sequence of statements, where the sequence of statements is randomly generated and placed in an order of execution that will be followed during the validation testing, and at least a portion of the statements include some ambiguity that will be exploited as discussed further. Based on each statement, a number of instructions for the respective portion of the test program are generated and are added to the test program. Therefore, for each statement in the sequence of statements, a set of instructions is generated and added to the test program. The instructions are generated on a statement-by-statement basis in the order of placement in the test template until the statements are exhausted and a complete first test program is generated based on the test template and the sequence of statements therein.

The first test program is executed on the DUT. Once the first test program is executed, the generation process for the second test program proceeds. Since at least a portion of the statements include ambiguities, a second set of instructions is generated for each such statement, where the second set of instructions are at least slightly different from the first set of instructions. Therefore, the second test program is at least slightly different from the first test program. As the varying instructions are generated from the statements with ambiguities, such instruction generation may be randomized within established parameters, i.e., and without limitation, one of the multiple varying instructions for a particular statement may be selected randomly. However, the order of the selected instructions will be consistent with the order of the statements in the test template. The second test program is executed on the DUT. The test program generation and the test program execution are performed iteratively until an established stopping point is reached, which in some embodiments, may be exhaustion of every possible iteration of the instructions that may be generated from the respective statements, and in some embodiments, exhaustion of the desired number of exerciser images and/or exhaustion of time limits for the respective exerciser images. In some embodiments, multiple test templates may be used and the described process is used for each test template. Accordingly, the generation and execution of the test programs has some randomness intrinsically established therein, thereby facilitating robust testing of the DUT.

Many known modern processors include high-performance central processing units (CPUs) that are configured to execute multiple parallel operations simultaneously. For example, some known high-performance CPUs use out-of-order execution to execute instructions in an order governed by the availability of the input data and the execution units rather than by the original order in a program. One of the benefits of out-of-order processing includes reducing the time periods where the processor may be idle while waiting for the preceding instruction to complete and can, in the meantime, process the next instructions that are able to run immediately and independently, thereby facilitate making use of instruction cycles that would otherwise be wasted. In addition, many such known high-performance CPUs use simultaneous multithreading (SMT) for improving the overall efficiency of superscalar CPUs (i.e., CPUs with multiple execution units thereon for executing more than one instruction during a clock-cycle) with hardware multithreading. SMT permits multiple independent threads of execution to better utilize the resources provided by modern processor architectures. Moreover, a further example of the highly parallel nature of modern high-performance CPUs is the use of certain independent execution units on the CPU configured for specific data types, i.e., floating-point (FP) data types, geoprocessing (GP) data types, and vector data types.

In addition to the parallel nature of modern high-performance CPUs, such CPUs may sit on a system on a chip (SoC) that is an integrated circuit that integrates all or most components of a computer or other electronic system. These components typically include one or more of the previously described high-performance CPUs, memory, input/output (I/O) ports, and secondary storage, often alongside other components such as radio modems and a graphics processing unit (GPU), all on a single substrate or microchip. The device may contain digital, analog, mixed-signal, and often radio frequency signal processing functions. Accordingly, modern SoCs are substantially heterogeneous and such SoC may be the DUT, where the validation tests will be generated to induce stimuli to test all of the components and interfaces, including, without limitation, memory coherence. Memory coherence is a scheme (i.e., a memory coherence protocol) used on multicore devices with two or more processors that may share one or more common areas of memory to notify all of the processing elements of changes to any shared values in the shared memory areas.

As discussed above, at least some of the known post-silicon validation systems and methods combine the use of the test templates, testing knowledge, and test randomness to validate the various features of the DUT through the generation and execution of the test exercises. Also, as described above, the test generation is typically executed though a statement-by-statement instructions generation process subject to the order of statement positioning within the test template. Therefore, many known known post-silicon validation systems and methods cannot generate most-realistic validation tests that will use the many registers for the various data types and exercise the intrinsic parallelism of the DUTs being validated. In addition, some CPUs are optimized for processing the instructions generated by a compiler, which are typically more complex than the unstructured code used in many known post-silicon validation systems and methods, and therefore the respective features do not get tested, e.g., and without limitation, loop unrolling and vector computations. In some embodiments, many of the planned testing schemes may be of high complexity, thus making the test generation a complex task. More specifically, in at least some embodiments of these known systems and methods, the desired conditions are manually integrated into the test programs, thereby manually increasing the complexity of generation of the test programs.

A system, computer program product, and method are disclosed and described herein for conducting post-silicon validation testing through the use of a compiler embedded in the exerciser, i.e., in either the off-line portion or the on-line portion. Loading a compiler into the exerciser facilitates executing a method for off-DUT creation of compiler generated code snippets as a means of augmenting the test generator and the generated tests, thereby enabling complex test scenarios which stimulate the entire width of the testing pipeline into, and through, the DUT as well as any special engines or accelerators native to the DUT. Moreover, similar results may be found in loading a compiler into the DUT for on-DUT creation of the compiler generated code snippets. The compiler, whether positioned off-DUT or positioned on-DUT, includes vectorization and optimization that are well known mechanisms in the compilers domain.

The vectorization features, sometimes referred to as automatic vectorization, in parallel computing, is a special case of automatic parallelization, where a computer program is converted from a scalar implementation, which processes a single pair of operands at a time, to a vector implementation, which processes one operation on multiple pairs of operands at once. For example, automatic vectorization may rewrite a loop so that instead of processing a single element of an array N times, it is now possible to process 4 elements of the array simultaneously N/4 times. Such parallelization features of the compiler facilitate testing the intrinsic parallelism of the DUTs being validated. The optimization features facilitate the compiler transforming a piece of code into another functionally equivalent piece of code for the purpose of improving one or more of the original code's characteristics. In at least some respects, two important characteristics for the code are the speed and size thereof. Such automatic optimization reduces the need for programmers or other computer technicians to manually revise a program. The use of such compilers in the validation process facilitates generating extremely complex assembly code from higher-level language code, even the simplest C-programs, for example, and creating intrinsic parallelization opportunities for the CPU's out-of-order processing features. In addition, the compilers may be configured to generate snippets of assembly code from snippets of the higher-level language C-code to test specific features at random, thereby enhancing the respective testing through random biased test generation via the compiled snippets.

In addition to the parallelization features, the use of a memory manager to perform memory allocation facilitates reserving only as much memory as needed to test Memory Management Units (MMUs) (not shown) on the DUT. Accordingly, the use of a compiler in the validation system and methods facilitates using the features of the exercisers that are natively parallel such that memory allocation and translation may be exercised aggressively to identify defects on the DUT in a disruptive manner.

In some embodiments, as mentioned above, the use of C-code through the compiler may be performed through the use of compiled snippets, i.e., snippets of compiled C-code that may be used to generate small modular function templates that use the same parameters as the exerciser. In some embodiments, any higher-level programming language that enables operation of the systems described herein through the methods described herein is used. The compiler may be either off-line, that is, positioned off-DUT, or may be loaded into the memory, i.e., positioned on-DUT.

In addition, memory allocation by the exerciser is executed through installing a memory manager and a memory allocator in the exerciser image builder and a memory access generator in the exerciser image to randomly allocate memory sections within the DUT in conjunction with the insertion of test instructions and the insertion of the compiled snippets. The random memory section allocations are at least partially based on requirements embedded in the test templates and are directed towards the respective portions of the DUT memory. The respective data in the portions of the memory allocated may be designated as invalid and secure to increase the level of difficulty in processing the data, thereby further stressing the DUT. In addition, many of the attributes of the data may be changed on the DUT to also stress the DUT further.

Furthermore, the introduction of structured compiler-based code into the test stream includes substantially seamless integration of the compiler-generated code into existing tests. Moreover, the use of the compiled C-code allows the use of recursive testing, including calling another language through the test templates, e.g., and without limitation, Extensible Markup Language (XML), where the compiled snippet code may be invoked and translated into XML to implement the respective instructions in real-time, thereby further enhancing the validation of the DUT and enhancing the biased test generation associated with the exerciser with the structured compiled instructions. Furthermore, integrating compilers into the validation testing facilitates automatically increasing the coverage of the testing through issuing hundreds of parallel instructions in a non-blocking order, without manual complication of the templates and adding verification value to the existing templates.

Accordingly, as described further herein, the test cases generated automatically through known validation techniques are enhanced through the use of compiler-generated instructions to augment the existing instructions through either an off-DUT or on-DUT creation of compiler generated code snippets. The enhancement is at least partially based on a compiler creating an instruction stream which has a structure and inserts optimizations to exploit parallel processing units in the CPU, for example loop unrolling or vector computations, in contrast to a random biased method which is used in an exerciser. In addition, the existing random memory allocation features further enhance the use of the compiled instructions to fully utilize the testing and DUT pipeline, including any special engines and accelerators, if present.

Figure 1A:
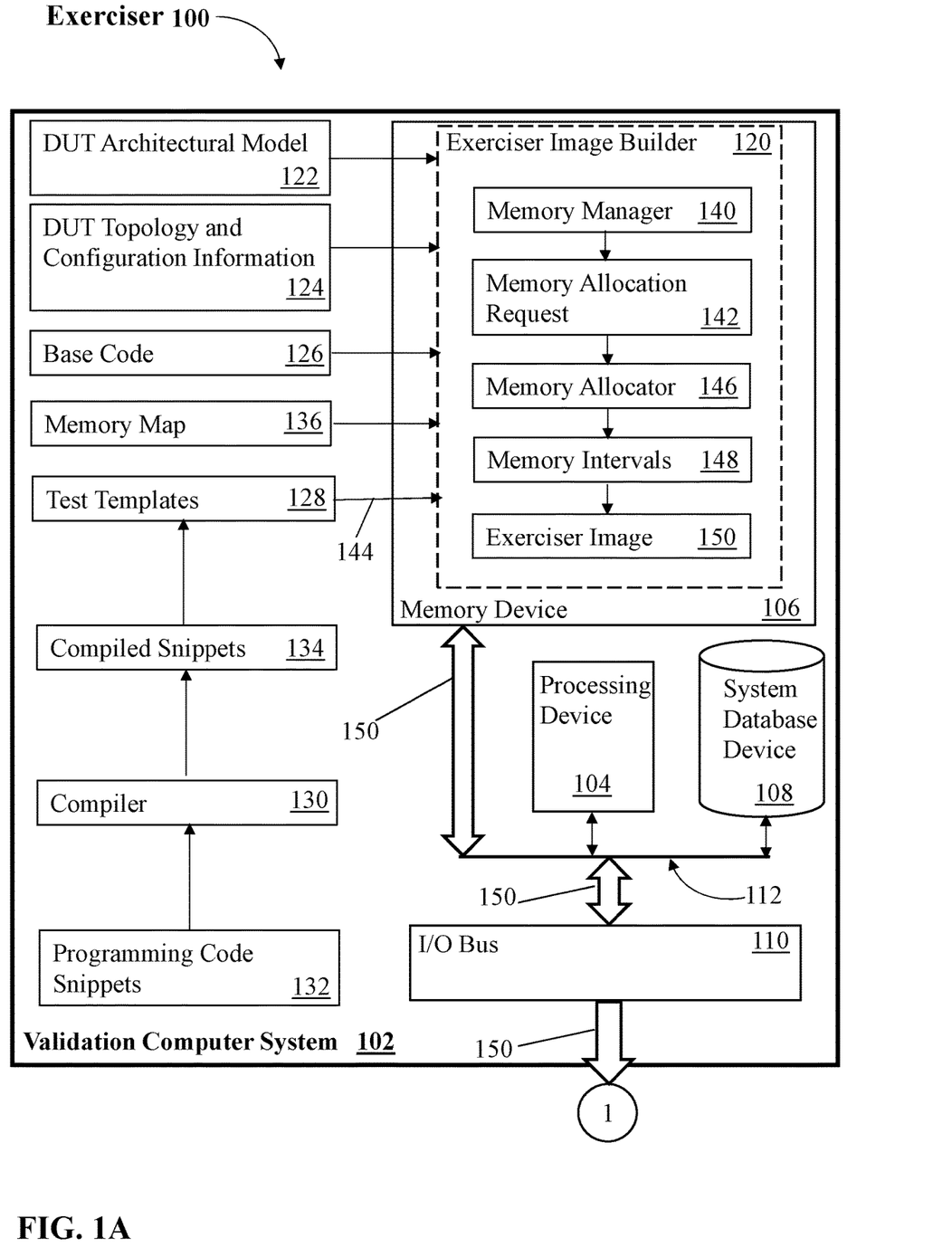
FIG. 1A is a schematic diagram illustrating an exerciser including a validation computer system, in accordance with some embodiments of the present disclosure.

Referring to FIG. 1A, a schematic diagram is provided illustrating a computer system 100 including a validation computer system 102. In at least some embodiments, the computer system 100 is an exerciser, therefore computer system 100 and exerciser 100 are used interchangeably herein. The validation computer system 102 includes one or more processing devices 104 (only one shown), one or more memory devices 106 (only one shown), one or more system database devices 108 (only one shown), and an input/output (I/O) bus 110 communicatively coupled together through a bus network 112. The validation computer system 102 is principally employed as the off-DUT portion of the exerciser 100 for test case generation.

In one or more embodiments, an exerciser image builder 120 is resident within the memory device 106. The exerciser image builder 120 may be configured to generate an exerciser image 150 that will in turn be used to generate a test stream 196 (shown in FIG. 1B) for testing a device-under-test (DUT) 180 (shown in FIG. 1B). The exerciser image builder 120 may be a computerized tool, such as implemented in hardware, software, or a combination thereof. The exerciser image builder 120 may be configured to receive different inputs as data from which the exerciser image 150 may be built. In some embodiments, such inputs include a DUT architectural model 122 that may be injected off-line into the exerciser image builder 120 to facilitate generating test cases on-line that invoke different architectural aspects of the target device. As used herein, a "test case" is a set of stimuli to the DUT 180 that may include instructions for the DUT 180 to process. The test cases may further include initialization values to registers (not shown) of the DUT 180. The terms "test case" and "test program" are used interchangeably herein.

Additionally, DUT topology and configuration information 124 may be provided as an input to the exerciser image builder 120. The topology and configuration information 124 may be injected off-line into the exerciser image 150 to facilitate generating test cases on-line that test different aspects of the topology and configuration of the DUT 180. Further, in some embodiments, base code 126 may be provided as input, where the base code 126 may include program instructions to be added to the exerciser image 150. In some embodiments, the exerciser image 150 may be based on the base code 126. In some embodiments, the program instructions may be operative to provide predetermined operating system services and/or features to a bare-metal validation platform 190 (shown in FIG. 1B). Moreover, in some embodiments, one or more test templates 128 may be provided as input to facilitate the exerciser image 150 generating the battery of validation testing that will be used to validate the DUT 180. Each of the test templates 128 include a plurality of statements 144 that are discussed further herein. The sources of the DUT architectural model 122, the DUT topology and configuration information 124, the base code 126, and the test templates 128 are any sources that enable operation of the exerciser 100 as described herein. In addition, the DUT architectural model 122, the DUT topology and configuration information 124, the base code 126, and the test templates 128 may be stored in the system database device 108.

In at least some embodiments, the validation computer system 102 includes a compiler 130 that receives programming code snippets 132 from a higher-level language and generates compiled snippets 134 that are injected into the test templates 128. In some embodiments, the higher-level language programming codes snippets 132 are selected as a function of the statements embedded within the selected test template 128. In some embodiments, the programming code snippets 132 are in the higher-level programming language C. In some embodiments, the programming code snippets 132 are in any programming language that enables operation of the exerciser 100 as described herein. In some embodiments, the compiler 130 is resident within an external computing device (not shown), and in some embodiments, the compiler 130 is resident within the memory device 106. In some embodiments, the programming code snippets 132 are stored in the system database device 108.

In some embodiments, the selection of the programming code snippets 132 is guided by a statement in the test template 128. As the validation testing is being executed on the DUT 180, the test generator 174 injects a call to the compiled snippet 134. As previously described, the compiled snippet 134 that is the subject of the call is based on the respective programming code snippet 132 that will be compiled by the compiler 130. The respective programming code snippet 132 is selected as a function of the present instructions being generated by the test generator 176 from the exerciser image 150, where the present instructions are associated with the particular statement in the test template 128 that are correlated to the programming code snippet 132. In addition, the test template 128 includes sufficient information embedded therein to prepare the appropriate parameters for the injection of the compiled snippet 134 at the point of the call during the validation testing of the DUT 180 as directed by the test template 128. In some embodiments, for those instances where there is more than one programming code snippet 132 associated with a particular statement in the test template 128, the exerciser image builder 120 will select the respective programming code snippet 132 for compiling by the compiler 130 with the subsequent injection of the respective compiled snippet 134 into the test program 172 through the exerciser image 150 at run-time.

In at least one embodiment, another input into the exerciser image builder 120 is a memory map 136 that includes the amount of memory 162 (see FIG. 1B) of the DUT 180 and its topology including, without limitation, descriptions of page boundaries, segment boundaries, and page attributes (e.g., cacheable or non-cacheable). The exerciser image builder 120 includes a memory manager 140 that is configured to generate one or more memory allocation requests 142. The memory allocation requests 142 are at least partially based on requirements embedded in the test templates 128. The exerciser image builder 120 also includes a memory allocator 146 configured to receive the memory allocation requests 142 from the memory manager 140 and randomly select memory intervals 148 from the memory 162. The randomly selected memory intervals 148 are injected into the exerciser image 150 and are used as described further herein.

In one or more embodiments, the exerciser image builder 120 may be configured to manipulate any input provided to it before storing corresponding data in the system database device 108. In one embodiment, the exerciser image builder 120 may strip down information that is not needed by the exerciser image 150 and/or may pre-calculate information to reduce the amount of data to be retained in the exerciser image 150. Also, in at least some embodiments, the exerciser image 150 may include, or retain, additional useful information such as data and metadata associated with the DUT architectural model 122, the DUT topology and configuration information 124, the base code 126, the test templates 128, and the memory map 136 based upon generation of present and previous test-cases. Accordingly, the exerciser image builder 120 includes sufficient data to build the exerciser image 150 that will be used to test the DUT 180.

Figure 1B:
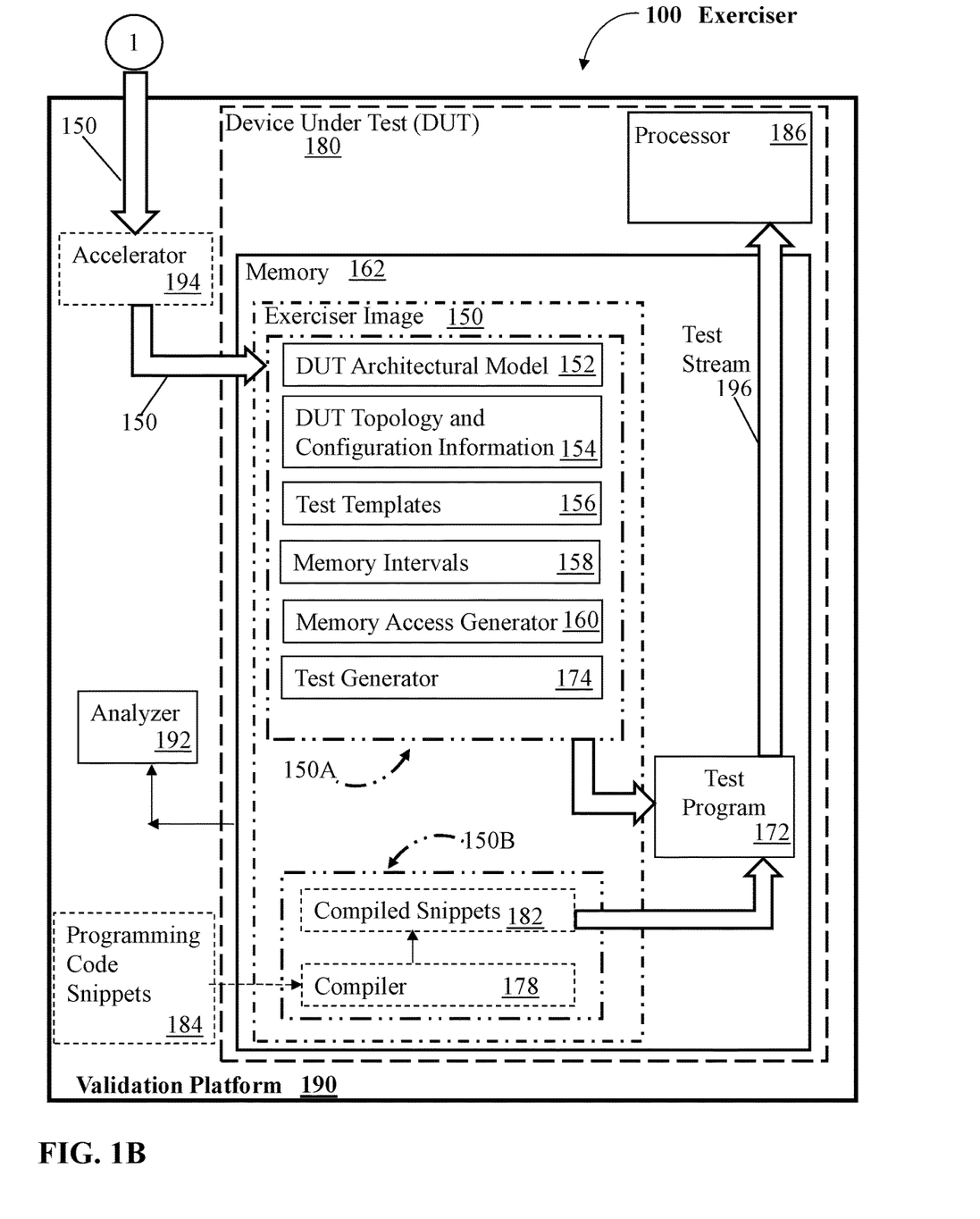
FIG. 1B is a continuation of the schematic diagram of FIG. 1A of the exerciser including a bare-metal validation platform, in accordance with some embodiments of the present disclosure.

Referring to FIG. 1B, a continuation of the schematic diagram of FIG. 1A illustrating the exerciser 100 is provided, including a bare-metal validation platform 190. Also continuing to refer to FIG. 1A, as described above, the validation computer system 102 is principally employed as the off-DUT portion of the exerciser 100 for exerciser image generation. In contrast, the validation platform 190 is principally employed as the on-DUT portion of the exerciser 100 for test case execution. Also, as described above, the validation computer system 102 includes sufficient resources within the processing device 104, the memory device 106, and the system database device 108 to use the exerciser image builder 120 to build the exerciser image 150. The built exerciser image 150 is transmitted from the validation computer system 102 to the validation platform 190 through the I/O bus 110. In one or more embodiments, the exerciser image 150 includes sufficient program instructions configured to cause the DUT 180 to singly and repeatedly perform generation and execution of one or more test cases 172. For example, a same test case may be executed a plurality of times, and the results may be compared for consistency. In some embodiments, the exerciser image 150 may include sufficient code to provide the DUT 180 with functionality that is not provided by the bare metal validation platform 190, such as, and without limitation, operating system features such as, without limitation, interrupt handlers, address translation, and memory management. Once the exerciser image 150 is loaded onto the validation platform 190, the exerciser image 150 may be used to generate the test program 172 to be executed by the DUT 180 to perform a functional and/or operational validation thereof.

In one or more embodiments, the exerciser image 150 includes a first portion 150A as built and transmitted to the validation platform 190 by the validation computer system 102. In some embodiments, the exerciser image 150 also includes a second portion 150B discussed further below. The first portion 150A of the exerciser image 150 includes the DUT architectural model 152, the DUT topology and configuration information 154, and the test templates 156 that are based on the DUT architectural model 122, the DUT topology and configuration information 124, the base code 126, and the test templates 128, respectively, that have been selected and modified by the validation computer system 102 for the particular scheduled tests for the DUT 180. In addition, the exerciser image 150 includes memory intervals 158 that are based on the memory intervals 148 generated as previously described. In addition, in some embodiments, the exerciser image 150 includes a memory access generator 160 configured to execute the memory intervals 158. The validation platform 190 includes the exerciser image 150 resident within a memory 162 on the DUT 180. The exerciser image 150 is used to generate the particular test program 172 that will be executed and managed by a test generator 174 that is also embedded within the exerciser image 150. In some embodiments, the test generator 174 is a software artifact that coordinates the scheduling of the test-cases, including the injection of the validation testing code and memory allocation.

In some embodiments, the exerciser image 150 includes a second portion 150B that includes a compiler 178 for on-DUT generation of compiled snippets 182 in contrast to the compiler 130 for off-DUT generation of compiled snippets 134 as shown in the validation computer system 102 (see FIG. 1A); therefore, the respective higher-level language programming code snippets 184, the compiler 178, and the compiled snippets 182 are illustrated in phantom within the second portion 150B of the exerciser image 150. The higher-level language programming code snippets 184 may be provided through any means that enables operation of the exerciser 100 as described herein. Operation of the off-DUT and on-DUT embodiments is discussed further with respect to FIGS. 2A-2C.

The validation platform 190 also includes sufficient physical space and connection ports to receive the DUT 180. In some embodiments, the DUT 180 includes a processor 186 and the memory 162 is communicatively and operably coupled to the processor 186. In some embodiments, additional devices may be embedded within the DUT 180. Also, in some embodiments, the validation platform 190 includes, and without limitation, an analyzer 192, e.g., an oscilloscope, and an accelerator 194 (shown in phantom), which in some embodiments, may be an optional device. The accelerator 194 may be used to accelerate the transmission of the exerciser image 150 into the memory 162 of the DUT 180. The results and other data captured during the validation testing may be captured in suitable collection devices not shown or the validation computer system 102. Accordingly, the validation platform 190 is configured to execute the validation testing of the DUT 180 through a bare-metal testing process. The functionality of the exerciser 100 is discussed further herein with respect to FIGS. 2A-2C.

Figure 2A:
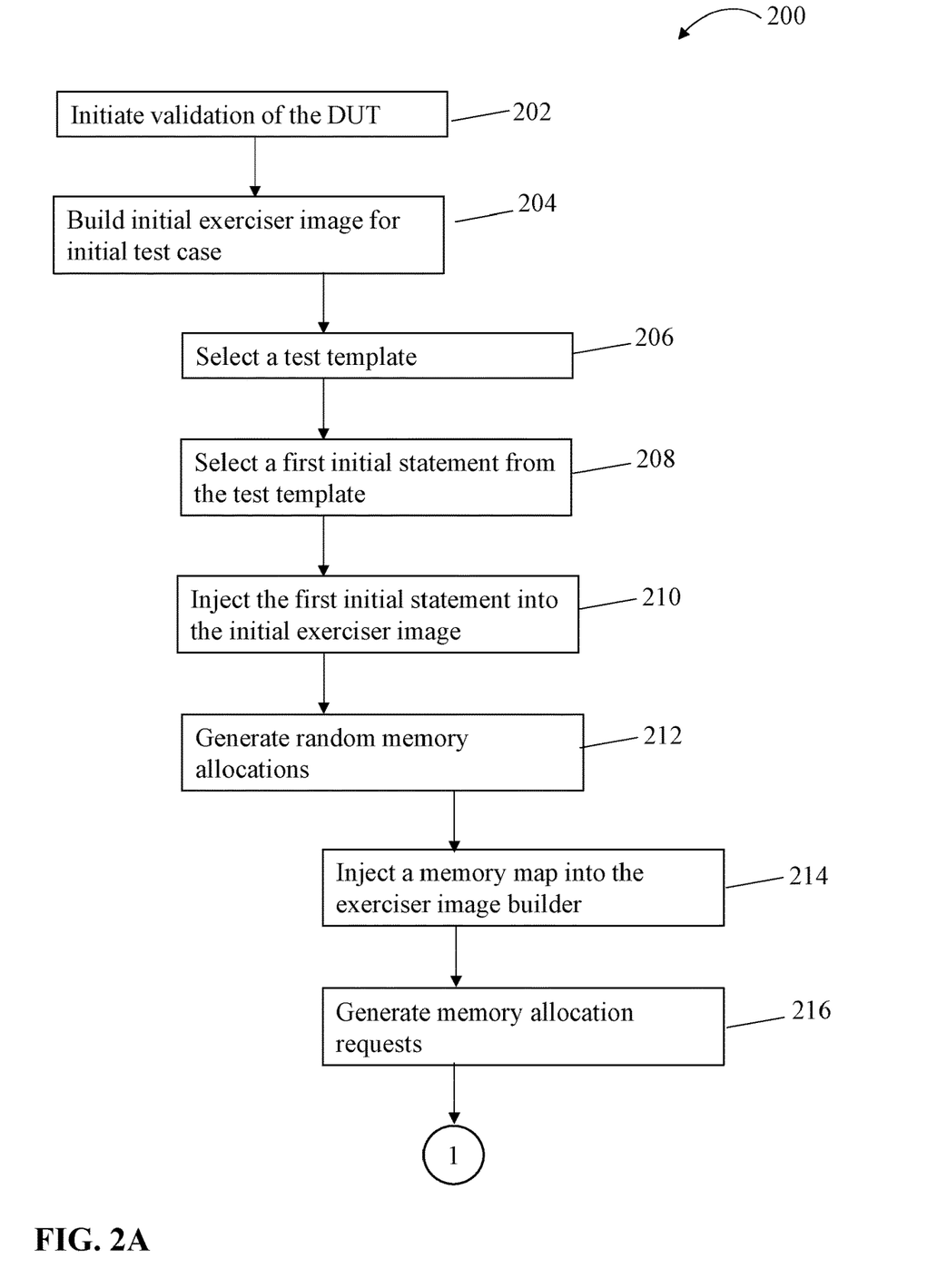
FIG. 2A is a flowchart illustrating a process for generating and executing post-silicon test programs for a device-under-test (DUT) using the exerciser of FIGS. 1A and 1B, in accordance with some embodiments of the present disclosure.

Referring to FIG. 2A, a flowchart is provided illustrating a process 200 for generating and executing post-silicon test programs for the device-under-test (DUT) 180 using the exerciser 100 of FIGS. 1A and 1B. Referring to FIGS. 1A-1B as well, the process 200 starts with initiating 202 validation of the DUT 180. An initial exerciser image 150 is built 204 for an initial test case through the exerciser image builder 120. In some embodiments, the test templates 128 are previously generated, i.e., written by a user, and stored in the system database device 108 as a library of test templates 128. In some embodiments, a first test template 128 is selected 206 either automatically, or by specific selection by a user to test one or more particular features of the DUT 180. The selection 206 of test templates 128 may be for a particular test battery and may, or may not, be edited for such particular test battery. The test templates 128 include the initial statements 144 therein that will be used to generate the instructions for executing the initial test case. Accordingly, a first initial statement 144 from the selected test template 128 is selected 208 subject to the order of the statements resident within the test template 128 and the first initial statement 144 is injected 210 into the initial exerciser image 150 through the exerciser image builder 120.

In at least some embodiments, the process 200 further includes generating 212 memory allocations to be used during the validation testing of the DUT 180. The memory map 136 is injected 214 into the memory manager 140 that is resident within the exerciser image builder 120. The memory map 136 includes the amount of memory 162 of the DUT 180 and its topology including, without limitation, descriptions of page boundaries, segment boundaries, and page attributes (e.g., cacheable or non-cacheable). The memory manager 140 generates 216 one or more memory allocation requests 142. The memory allocation requests 142 are at least partially based on requirements embedded in the test templates 128. The memory allocation requests are transmitted to the allocator 146 that receives the memory allocation requests 142 from the memory manager 140.

Figure 2B:
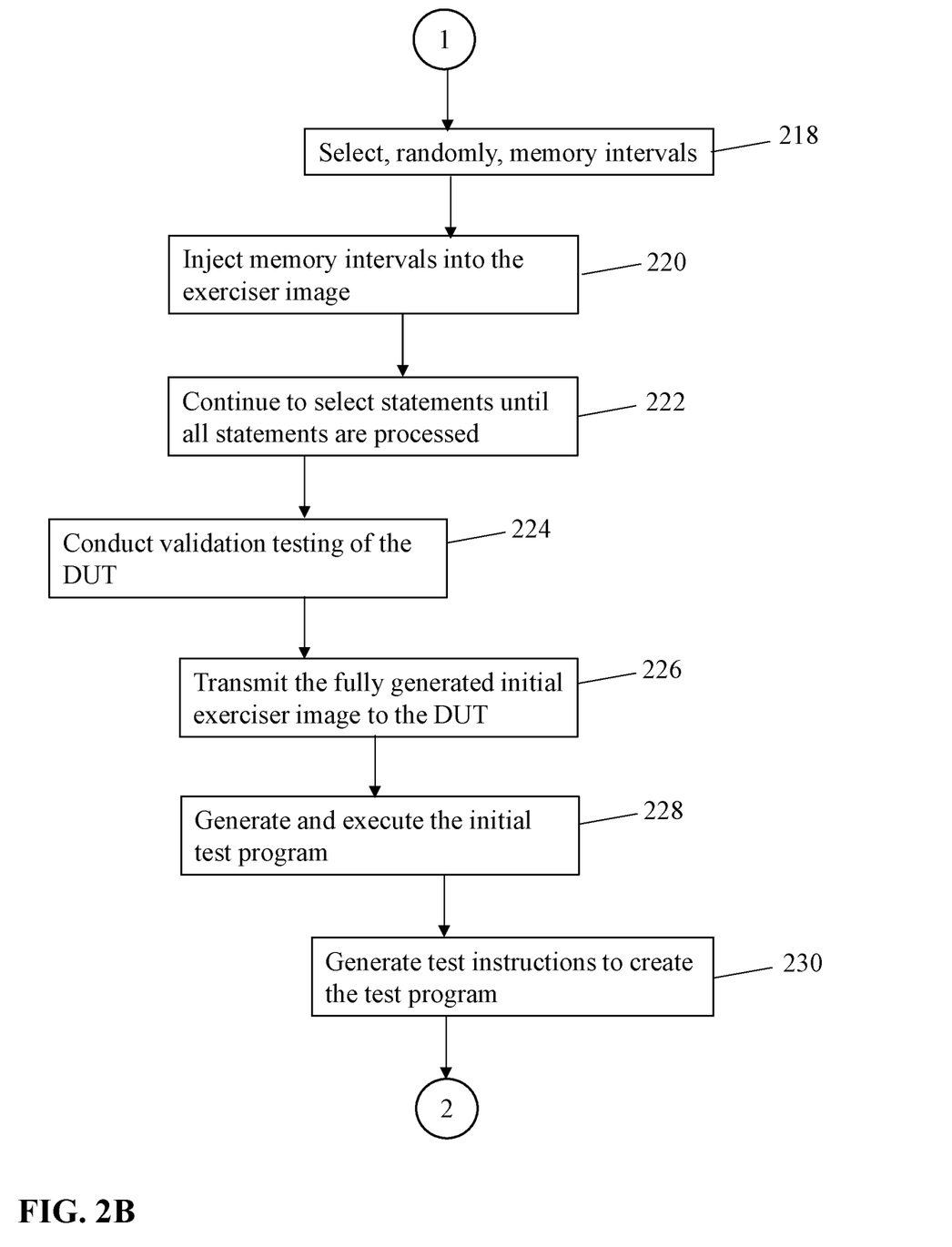
FIG. 2B is a continuation of the flowchart of FIG. 2A, in accordance with some embodiments of the present disclosure.

Referring to FIG. 2B, a continuation of the flowchart of FIG. 2A is provided. Continuing to refer to FIGS. 1A-1B, and 2A, the exerciser image builder 120 randomly selects 218 memory intervals 148 from the memory 162. The randomly selected memory intervals 148 are injected 220 into the exerciser image 150 through the exerciser image builder 120. Accordingly, random memory allocation embedded in the exerciser image facilitate enhancement of the performance of the validation testing 200.

In many embodiments, the exerciser image 150 includes a plurality of statements 144 from the respective test template 128 and the randomly selected memory intervals 148. Therefore, the process 200 includes continuing to select 222 statements 144 in the order of occurrence in the test template 128 until all of the initial statements 144 from the test template 128 are processed and embedded in the initial exerciser image 150. In addition, the associated memory intervals 148 are injected into the exerciser image builder 120 for placement into the appropriate spots in the exerciser image 150.

The process 200 then proceeds to conducting 224 the validation testing of the DUT 180 with the fully generated initial exerciser image 150. The fully generated initial exerciser image 150 is transmitted 226 from the exerciser image builder 120 (or, in some embodiments, from the system database device 108) in the validation computer system 102 to the memory 162 of the DUT 180 through the I/O bus 110. The fully generated initial exerciser image 150, once transmitted to, and received by, the memory 162 of the DUT 180 is referred to as the first portion 150A of the initial exerciser image 150. The first portion 150A of the initial exerciser image 150 includes the DUT architectural model 152, the DUT topology and configuration information 154, and the test templates 156 that are based on the DUT architectural model 122, the DUT topology and configuration information 124, the base code 126, and the test templates 128, respectively, that have been selected and modified by the validation computer system 102 for the particular scheduled tests for the DUT 180. In addition, the first portion 150A of the initial exerciser image 150 includes the memory intervals 158 and the memory access generator 160. Moreover, the first portion 150A of the initial exerciser image 150 includes the test generator 174.

In at least some embodiments, upon receipt of the exerciser image in the DUT 180, the test generator 174 generates 228 and executes the initial test program 172 from the selected statements 144 embedded in the test template 156 through the exerciser image builder 120 with the randomly inserted memory intervals 158. Such generation 230 of the testing instructions includes issuing hundreds of instructions in a non-blocking order, without manual complication of the templates, as the test stream 196.

Figure 2C:
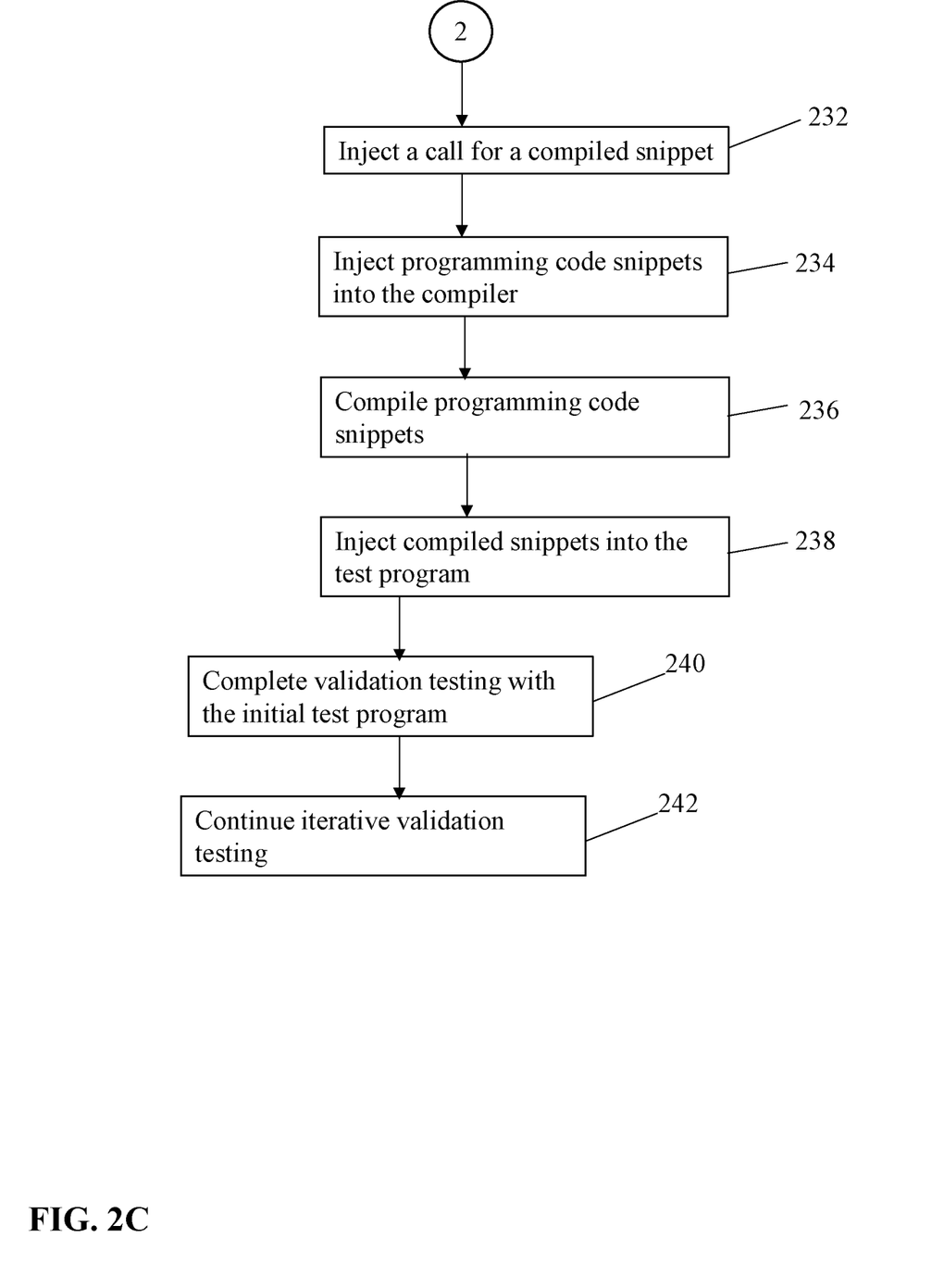
FIG. 2C is a continuation of the flowchart of FIG. 2B, in accordance with some embodiments of the present disclosure.

Referring to FIG. 2C, a continuation of the flowchart of FIG. 2B is provided. Continuing to refer to FIGS. 1A-1B, and 2A-2B, in at least some embodiments, the process 200 includes the use of the compiler 130 to facilitate automatically generating test cases that fully utilize the testing pipeline from the exerciser image 150 through the processor 186 of the DUT 180. Therefore, the compiler 130 creates off-DUT compiler generated code snippets, i.e., compiled snippets 134, from programming code snippets 132 as a means of augmenting the validation testing of the DUT 180 through creating complex test programs which stimulate the entire width of the testing pipeline.

In at least some embodiments, the CPUs on modern chips are optimized for the compiled code that compilers generate, such compiled code being much more complex than unstructured code, and the use of compiled code facilitates testing those features on the DUT 180. Therefore, as the test instructions for the test program 172 are generated from the statements 144 embedded in the initial test template 156 through the test generator 174, a call for the associated programming code snippets 132 will be injected 232 into the appropriate portion of the test program 172 as guided by the respective statement 144. Specifically, in some embodiments, one or more programming code snippets 132 are injected 234 into the compiler 130. Typically, the selection of code snippets 132 is guided by a particular statement 144 in the respective test template 128 through criteria embedded within the statement 144. If there is more than one code snippet 132 that matches a selection criterion, the exerciser image builder 120 will select one of the code snippets 132 randomly. This selected code snippet 132 will be compiled 236 by the compiler 130 and the compiled snippet 134 will be added to the exerciser image 150 as the exerciser image 150 runs on the DUT 180 and the compiled snippets 134 are injected 238 into the test program 172 according to the respective statement 144 in the respective test template 156. Additionally, the test generator 174 will prepare parameters required for this snippet call and add them into the respective test case 172. This call and the respective parameters will be added exactly as the test template 156 determines.

In some embodiments, the programming code snippets 132 are coded using the C programming language. In some embodiments, any programming language that enables operation of the exerciser 100 through the process 200 as described herein is used. The programming code snippets 132 are created to generate specific testing conditions. In general, the test generator 174 generates test programs 172 transmitted through the test stream 196 that are intrinsically pseudo-random. The creation of, and injection of, the compiled snippets 134 through the compiler 130 facilitate increasing the randomness of the validation test exercises. In addition, small modular function test templates 156 may be generated to test any unique features on the DUT 180, including, without limitation, special engines, accelerators, and independent execution units that are configured for the different data types, e.g., and without limitation, FP, GP, and Vector. Furthermore, the types of the values being operated on may be changed from compiled snippet 134-to-compiled snippet 134. For example, a first compiled snippet 134 may be directed toward integers, and a second compiled snippet 134 may be directed toward floating points. Moreover, the relatively small compiled snippets 134 facilitate increasing the parallelism of the test templates 156, and therefore, the parallelism of the exerciser image 150. Therefore, the complexity of the more elaborate compiled snippets 134 may enhance the complexity of the test programs 172, that, in some embodiments, are substantially written by a human.

In addition, the parameters of the exerciser 100 may also be used for the programming code snippets compiling operation 236 through the compiler 130, thereby further facilitating consistency of the compiled snippets 134 with the remainder of the exerciser 100. Moreover, the compiler 130 is configured to further streamline the injected programming code snippets 132 through the compiler's 130 intrinsic properties to remove portions of the code that are not useful and optimize the code. In addition, other optimization features of the compiler 130 may be maintained and leveraged, such as loop unrolling. Even though breaking the code up into the programming code snippets 132 facilitates overcoming such intrinsic properties, the compiler 130 does not remove any portions of the programming code snippets 132. Such features thereby allow code to remain in the compiled snippets 134 that typically might not otherwise make it to the test program 172 due to elimination of purposely added deficiencies that are designed to stress the DUT 180. Furthermore, the smaller compiled snippets 134 facilitate eliminating sequential dependencies within the test program 172 by eliminating such dependencies in the individually contained compiled snippets 134 and configuring the compiled snippets 134 to run as many concurrently as practical, thereby significantly reducing a potential for one compiled snippet 134 to block another due to inferred sequential requirements. Also, the use of smaller, modular, functional compiled snippets 134 in the test facilitates generating unique test cases that may be configured to further stress the DUT 180. Moreover, more than one version of the compiler 130 may be used to generate the compiled snippets 134 to take advantage of the different compiling features of each.

In general, compilers are configured to inhibit the randomization of the memory through attempting to load as much of the compiled code into one page of memory to reduce the chance of memory interruption across the memory device such that the portions of the code are proximate each other. However, the validation testing attempts to do the opposite to stress the DUT 180, even with the simplest code loading to process. Also, in general, the DUT 180 will likely be configured to handle sequential memory access in a serialized manner with little to no stressing. Therefore, portions of the code and data allocations may be randomized as described herein to disrupt serial memory access. As described above, compilers are typically configured to allocate compiled code and data so that it can be accessed sequentially, which makes it easier and more efficient for the CPU. The compilers described herein are configured to allocate test instructions and the associated data in an "interesting" manner so that CPU will work hard to fetch instructions and the required data. The random memory intervals significantly reduce the ordered memory allocation, thereby, in at least some instances, defeating the ordered memory access and thereby increasing the stress on the DUT 180 during the validation testing. In at least some embodiments, data that would typically be properly aligned, valid, protected, and flushed under normal operation of the DUT 180 may now be retained and used to enhance the stressing of the DUT 180. Accordingly, the previously discussed generation and ingestion of the programming code snippets 132 by the compiler 130 compiles the compiled snippets 134 as guided by the respective invocations by the statements 144 in conjunction with randomly allocating the memory stacks to be tested.

In some embodiments, for a typical program written in C programming language, under standard processing conditions, the compiler and an associated linker (not shown) configure the memory sections in a manner that should avoid any data collisions, where the data will reside in one page, and would fit perfectly in cache. However, as described herein, programming code snippets 132 are used rather than whole programs, including the introduction of the statements and the memory intervals to deliberately disorganize the data during the validation testing to maximize disruptive events, such as, and without limitation, data collisions.

In at least some embodiments, as the validation testing with the present, i.e., initial test program 172 is exhausted, the initial round of validation testing is completed 240, the test results will be recorded and checked, and the exerciser 100 will proceed to the next round of test program generation and testing. i.e., iterative validation testing will be continued 242. In at least some embodiments, the validation testing for a particular DUT 180 will require multiple test programs 172 to fully test the features on the DUT 180. As previously described herein, a test template 128 may be selected to test one or more particular features of the DUT 180. At least a portion of the statements 144 within the test template 128 include some ambiguity, and for those statements with sufficient ambiguities, a set of variant instructions will be generated for each statement, where the set of variant instructions are at least slightly different from the first set of instructions used for the initial round of testing. Therefore, the subsequent test programs may be at least slightly different from the initial test program. In some embodiments, it is possible to build many different exerciser images 150 from a single test template 128 and more than one test program 172 may be created with a single exerciser image 150. Also, in some embodiments, a particular exerciser image 150 may be used to execute the validation testing substantially endlessly until test execution is stopped, either manually, due to a predetermined time limit, or one or more checking failures are determined through the testing. In at least some embodiments, the process 200 proceeds to building the next exerciser image 150 for the next test case(s) 172 through the exerciser image builder 120 and the remainder of the test programs 172 intended to be executed. The process 200 will continue until the required number of exerciser images 150 are built and the test programs 172 for each respective exerciser image 150 have run their allotted amount of time.

In some embodiments, rather than using the off-DUT embodiment of the compiler 130 (as shown in FIG. 1A), the on-DUT compiler 178 as shown in FIG. 1B (see the second portion 150B of the exerciser image 150) is used. A substantial number of the operations associated with the process 200 for the off-DUT embodiment are substantially similar to that for the on-DUT embodiment.

Therefore, upon execution of the call injection operation 232, one or more programming code snippets 184 (that may be similar to the programming code snippets 132, shown in FIG. 1A) are injected 234 into the compiler 178. In some embodiments, the programming code snippets 184 are coded using the C programming language. In some embodiments, any programming language that enables operation of the exerciser 100 through the process 200 as described herein is used. The programming code snippets 184 are compiled 256 through the compiler 178 into a machine language in the form of the compiled snippets 182. The compiled snippets 182 are injected 238 into the respective test program 172 as guided by the respective statements 144. Accordingly, the on-DUT embodiment of the compiler 178 facilitates augmenting the test program 172 during validation testing.

The system, computer program product, and method as disclosed and described herein integrates compiler-based testing in post-silicon validation. As described herein, the test cases generated automatically through known validation techniques are enhanced through the use of compiler-generated instructions to augment the existing instructions through either an off-DUT or on-DUT creation of compiler generated code snippets from programming code written in a higher-level language. In addition, the existing random memory allocation features further enhance the use of the compiled instructions to fully utilize the testing and DUT pipeline, including any special engines and accelerators, if present, through issuing hundreds of random instructions in a non-blocking order, without manual complication of the templates and without adding further complexity to the test generator, for parallel execution thereof. In some embodiments, the exerciser as described herein may be used to test a model of the DUT on simulator or a hardware accelerator in pre-silicon validation.

The addition of compilers to the post-silicon validation process facilitates automatically adding test coverage and verification value to the existing test templates through substantially seamless integration of the compiler snippets to the test generated by the exerciser at little additional cost in image size and image build time. However, a large test generation and execution time reduction may be realized through more extensive use of optimized C-code and less extensive use of user XML, macros. Also, the complexity of the tests may be enhanced through the introduction of the compiled instructions coupled with the random memory intervals. In addition, automating the insertion of the compiled test instructions and the automated random memory allocations decrease the potential for human error being introduced during the image building activities and the validation test execution activities. In some embodiments, if there are issues associated with the C-code, the standard debugging tools may be applied to identify the source of the error.

The off-DUT compiler embodiments described herein and the on-DUT compiler embodiments automatically enhance the test programs used to generate the test streams transmitted to the DUT during run-time without increasing the size and complexity of the exerciser image. The incorporation of the compiler-generated code snippets into test generation increases the parallelization through combining traditional generation with assembly code produced by the compilers from higher-level languages adds variability to the compiler-created code. In addition, such incorporation of creation of compiler generated code snippets, as a means of augmenting the test generator and the created tests, enables complex test scenarios which stimulate the entire width of the pipeline, and/or any special engines or accelerators on the DUT. Moreover, the existing randomness of the testing sequences is preserved without adding complexity to the test generator.

Therefore, the embodiments disclosed herein provide an improvement to computer technology. For example, the generation processes as described herein facilitate post-silicon validation test generation that is more comprehensive as compared to known post-silicon tests. The implemented test generation and test execution operations as described herein include features to increase the frequency of data collisions. Therefore, the enhanced test generation and execution as described herein facilitates augmenting the intensity of the stress testing operations on the DUT. Accordingly, the improvement to computer technology is manifested in a practical technical application of the methods described herein to execute post-silicon validation testing of hardware devices through enhancing the generation of the tests and the execution thereof on the hardware being tested.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer system comprising:
   one or more processing devices configured to validate operation of a device-under-test (DUT) through post-silicon validation testing;
   one or more memory devices communicatively coupled to the one or more processing devices; and
   a compiler communicatively coupled to the one or more processing devices and the one or more memory devices, the one or more processing devices configured to:
      generate a test program through the DUT, comprising:
         generate a plurality of memory intervals;
         inject the plurality of memory intervals into the test program;
         inject, from the compiler, a plurality of compiled test snippets into the test program; and
         execute one or more post-silicon validation tests for the DUT with the test program.

2. The system of claim 1, the one or more processing devices further configured to:
   generate, through the compiler, compiler-based code configured for parallel execution within the DUT.

3. The system of claim 1, the one or more processing devices further configured to:
   generate, through the compiler, the plurality of compiled test snippets through a call injected into the test program.

4. The system of claim 1, the one or more processing devices further configured to:
   inject the plurality of memory intervals randomly.

5. The system of claim 1, the one or more processing devices further configured to:
   combine instructions generated through a statement with assembly code produced by the compiler from a higher-level language.

6. The system of claim 1, wherein the compiler is positioned off-DUT, the one or more processing devices further configured to:
   inject the compiled test snippets into the test program concurrently with the executing one or more post-silicon validation tests for the DUT.

7. The system of claim 1, wherein the compiler is positioned on-DUT, the one or more processing devices further configured to:
   inject the compiled test snippets into the test program concurrently with the executing one or more post-silicon validation tests for the DUT.

8. A computer program product, comprising:
   one or more computer readable storage media; and
   program instructions collectively stored on the one or more computer storage media, the program instructions comprising:
      program instructions to execute one or more post-silicon validation tests for a device-under-test (DUT) comprising:
         program instructions to generate a test program through the DUT, comprising:
            program instructions to generate a plurality of memory intervals;
            program instructions to inject the plurality of memory intervals into the test program;
            program instructions to inject a plurality of compiled test snippets into the test program; and
            program instructions to execute one or more post-silicon validation tests for the DUT with the test program.

9. The computer program product of claim 8, further comprising:
   program instructions to generate compiler-based code configured for parallel execution within the DUT.

10. The computer program product of claim 8, further comprising:
    program instructions to generate the plurality of compiled test snippets through a call injected into the test program; and
    program instructions to inject the plurality of memory intervals randomly.

11. The computer program product of claim 8, further comprising:
    program instructions to combine instructions generated through a statement with assembly code produced by a compiler from a higher-level language.

12. The computer program product of claim 8, further comprising:
    program instructions to inject the compiled test snippets into the test program concurrently with the executing one or more post-silicon validation tests for the DUT, wherein the compiler is positioned off-DUT.

13. The computer program product of claim 8, further comprising:
    program instructions to inject the compiled test snippets into the test program concurrently with the executing one or more post-silicon validation tests for the DUT, wherein the compiler is positioned on-DUT.

14. A computer-implemented method comprising:
    generating a test program through a device-under-test (DUT), comprising:
       generating a plurality of memory intervals;
       injecting the plurality of memory intervals into the test program;
       injecting a plurality of compiled test snippets into the test program; and
       executing one or more post-silicon validation tests for the DUT with the test program.

15. The method of claim 14, wherein the injecting a plurality of compiled test snippets into the test program comprises:

generating compiler-based code configured for parallel execution within the DUT.

16. The method of claim 14, wherein the injecting a plurality of compiled test snippets into the test program further comprises:
   generating the plurality of compiled test snippets through a call injected into the test program.

17. The method of claim 14, wherein the injecting the plurality of compiled test snippets into the test program further comprises:
   injecting the plurality of memory intervals into the test program randomly.

18. The method of claim 14, wherein the injecting a plurality of compiled test snippets into the test program further comprises:
   combining instructions generated through a statement with assembly code produced by a compiler from a higher-level language.

19. The method of claim 14, wherein the injecting a plurality of compiled test snippets into the test program further comprises:
   injecting the compiled test snippets into to the test program concurrently with the executing one or more post-silicon validation tests for the DUT, wherein the compiler is positioned off-DUT.

20. The method of claim 14, wherein the injecting a plurality of compiled test snippets into the test program further comprises:
   injecting the compiled test snippets into the test program concurrently with the executing one or more post-silicon validation tests for the DUT, wherein the compiler is positioned on-DUT.

* * * * *